(12) United States Patent
Edelstein

(10) Patent No.: US 6,762,954 B1
(45) Date of Patent: Jul. 13, 2004

(54) LOCAL PROBE OF MAGNETIC PROPERTIES

(76) Inventor: Alan S. Edelstein, 8002 Lynnfield Dr., Alexandria, VA (US) 22306

(*) Notice: Subject to any disclaimer, the term of this patent is extended or adjusted under 35 U.S.C. 154(b) by 0 days.

(21) Appl. No.: 10/434,337

(22) Filed: May 9, 2003

(51) Int. Cl.$^7$ .............................................. G11C 11/14
(52) U.S. Cl. ....................................... 365/173; 365/171
(58) Field of Search ................................ 365/173, 171, 365/158; 360/324.15; 324/252

(56) References Cited

U.S. PATENT DOCUMENTS

| | | | |
|---|---|---|---|
| 5,764,567 A | 6/1998 | Parkin | 365/173 |
| 6,072,382 A | 6/2000 | Daughton et al. | 338/32 R |
| 6,330,136 B1 | 12/2001 | Wang et al. | 360/324.2 |
| 6,349,053 B1 | 2/2002 | Daughton et al. | 365/145 |
| 6,381,171 B1 | 4/2002 | Inomata et al. | 365/173 |
| 6,418,048 B1 | 7/2002 | Sin et al. | 365/173 |
| 6,462,641 B1 | 10/2002 | Dieny et al. | 338/32 R |
| 2002/0008948 A1 | 1/2002 | Sasaki et al. | 360/324.12 |
| 2002/0047145 A1 | 4/2002 | Nickel | 257/295 |
| 2002/0068195 A1 | 6/2002 | Lundstrom | 428/694 |

*Primary Examiner*—Vu A. Le
(74) *Attorney, Agent, or Firm*—William V. Adams

(57) ABSTRACT

Systems and methods for probing the magnetic permeability of a material are disclosed. A sensor unit can be configured to comprise magnet layers thereof, including a soft ferromagnetic layer, a first hard ferromagnetic layer and a second hard ferromagnetic layer. An intermediate layer (e.g., conductor or insulator) can be disposed between the first hard ferromagnetic layer and the soft ferromagnetic layer within the sensor unit. Additionally, a spacer layer can be disposed between the soft ferromagnetic layer and the second hard ferromagnetic layer, wherein the sensor unit measures the magnetic properties of a material located a distance from the sensor unit through the magnetic interaction of the magnetic layers of the sensor unit. Conduction between the first hard ferromagnetic layer and the soft ferromagnetic layer generally occurs via tunneling.

18 Claims, 5 Drawing Sheets

LOCAL PROBE OF MAGNETIC PROPERTIES

STATEMENT OF GOVERNMENT INTEREST

The invention described herein may be manufactured and used by or for the United States Government for Governmental purposes without the payment of any royalties.

TECHNICAL FIELD

The present invention generally relates to magnetic sensor methods and systems. The present invention also relates to probing devices associated with magnetic sensors. The present invention additionally relates to spin-dependent tunneling (SDT) sensors.

BACKGROUND OF THE INVENTION

Magnetic films are used in a variety of devices that include magnetic random access memories MRAM and magnetic recording media. In the magnetic recording industry, information is generally stored as magnetic bits on thin ferromagnetic films. In reading such magnetic bits, the magnetic recording industry requires detection devices that measure the magnetization of small regions along a magnetic track. Computer storage devices, such as, for example, magnetic disk drives, utilize read/write-heads to store and retrieve data. A write head stores data by utilizing magnetic flux to set the magnetic moment of a particular area on a magnetic media. The state of the magnetic moment is later read by a read head, which senses the magnetic fields.

Presently, quality read heads utilize giant magnetoresistance (GMR) read heads, which are spin valves or similar to spin valves. Such GMR thin-film read heads employ magnetoresistive material, generally formed in a layered structure of ferromagnetic magnetoresistive and non-ferromagnetic nonmagnetoresistive materials, to detect the magnetic moments of the data bits on the media. A sensing current is passed through the magnetoresistive material to detect changes in the resistance of the material induced by the data bits as they pass the read head. Spin valves can be formed as three layer structures including a hard or pinned ferromagnet, a soft ferromagnet, and a thin intervening conductor.

Another device for measuring local magnetizations is a magnetic force microscope. Magnetic force microscopes are scanning tunneling microscopes with ferromagnetic tips.

The present inventor has recognized that a need exists for improved systems and methods for probing the magnetic properties of materials. In particular, the present inventor believes that a need exists for improved methods and systems for measuring the extent to which a local surface region of a material can be magnetized. Prior art magnetic sensing systems and methods are limited because most other magnetic probes do not measure how easily a material may be magnetized. Further, most other devices do not readily permit varying the length over which the material's magnetic properties are being probed.

Other methods for measuring local magnetization such as magnetic force microscopes and electron microscopes with magnetic electrodes that analyze the spin direction of tunneling electrons can be cumbersome, inefficient, and expensive. The present inventor has therefore devised a unique solution to these problems to effectively probe the magnetic properties of a particular material.

BRIEF SUMMARY OF THE INVENTION

The following summary of the invention is provided to facilitate an understanding of some of the innovative features unique to, the present invention and is not intended to be a full description. A full appreciation of the various aspects of the invention can be gained by taking the entire specification, claims, drawings, and abstract as a whole.

It is, therefore, one aspect of the present invention to provide for systems and methods for probing the magnetic properties of materials.

It is another aspect of the present invention to provide an improved magnetic sensor for probing the magnetic properties of materials.

It is another aspect of the present invention to provide a device for use as a magnetic recording read head for magnetic recording media in which the bits can be stored as soft and hard magnetic ferromagnetic material or as magnetic and/or non-magnetic material.

The above and other aspects can be achieved as is now described. Systems and methods for probing the magnetic properties of a material are described herein. A sensor unit can be configured to comprise magnet layers thereof, including a soft ferromagnetic layer, a first hard ferromagnetic layer and a second hard ferromagnetic layer. An intermediate layer, which can comprise an insulator or a conductor, can be disposed between the first hard ferromagnetic layer and the soft ferromagnetic layer within the sensor unit. Additionally, a spacer layer can be disposed between the soft ferromagnetic layer and the second hard ferromagnetic layer, wherein the sensor unit measures the magnetic properties of a material located a distance from the sensor unit through the magnetic interaction of the magnetic layers of the sensor unit. If there is an insulator between the soft ferromagnetic layer and the first hard ferromagnetic layer, then conduction between the first hard ferromagnetic layer and the soft ferromagnetic layer generally occurs via tunneling. If there is a conductor insulator between the soft ferromagnetic layer and the first hard ferromagnetic layer, then the conduction occurs in the plane of the layers and the three-layer structure composed of the soft ferromagnetic layer, the first hard ferromagnetic layer, and the intervening conductor functions as a spin valve.

Additionally, the thickness of the spacer layer and the thickness of the second hard ferromagnetic layer are respectively greater than the thickness of the insulating or conducting layer and the thickness of the second hard ferromagnetic layer. A magnetic interaction generally occurs between the second hard ferromagnetic layer and the soft ferromagnetic layer The magnetic interaction will increase if the thickness of the spacer layer is approximately equal to the distance to a magnetic surface or film with an appreciable magnetic permeability. This magnetic interaction can thus modify the magnetization of the soft ferromagnetic layer. When the magnetic interaction to the magnetic surface is reduced, the magnetization of the soft ferromagnetic layer should return to its original value. This can be accomplished by configuring the original direction of the magnetization of the soft layer by shape anisotropy or through the application of a biasing field.

In addition, if there is an insulator between the soft ferromagnetic layer and the first hard ferromagnetic layer, then a change in magnetization of the soft ferromagnetic layer results in a change in impedance between the first hard ferromagnetic layer and the soft ferromagnetic layer. If there is a conductor insulator between the soft ferromagnetic layer and the first hard ferromagnetic layer, then a change in magnetization of the soft ferromagnetic layer results in a change in impedance of the spin valve.

BRIEF DESCRIPTION OF THE DRAWINGS

The accompanying figures, in which like reference numerals refer to identical or functionally-similar elements throughout the separate views and which are incorporated in and form part of the specification, further illustrate the present invention and, together with the detailed description of the invention, serve to explain the principles of the present invention.

DETAILED DESCRIPTION OF THE INVENTION

The particular values and configurations discussed in these nonlimiting examples can be varied and are cited merely to illustrate embodiments of the present invention and are not intended to limit the scope of the invention.

Figure 1:
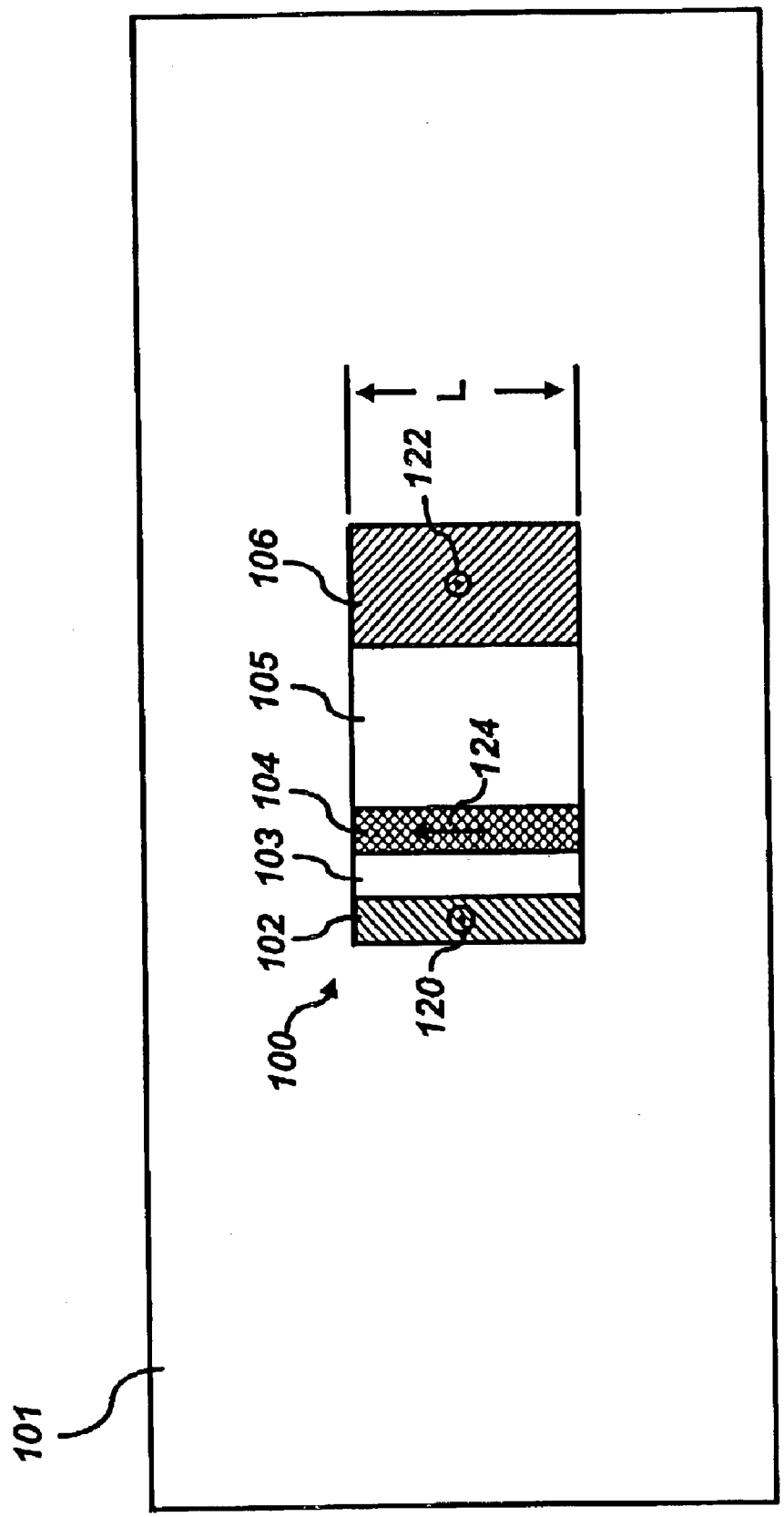
FIG. 1 illustrates a top view of a sensor, which can be implemented in accordance with a preferred embodiment of the present invention.
Figure 2:
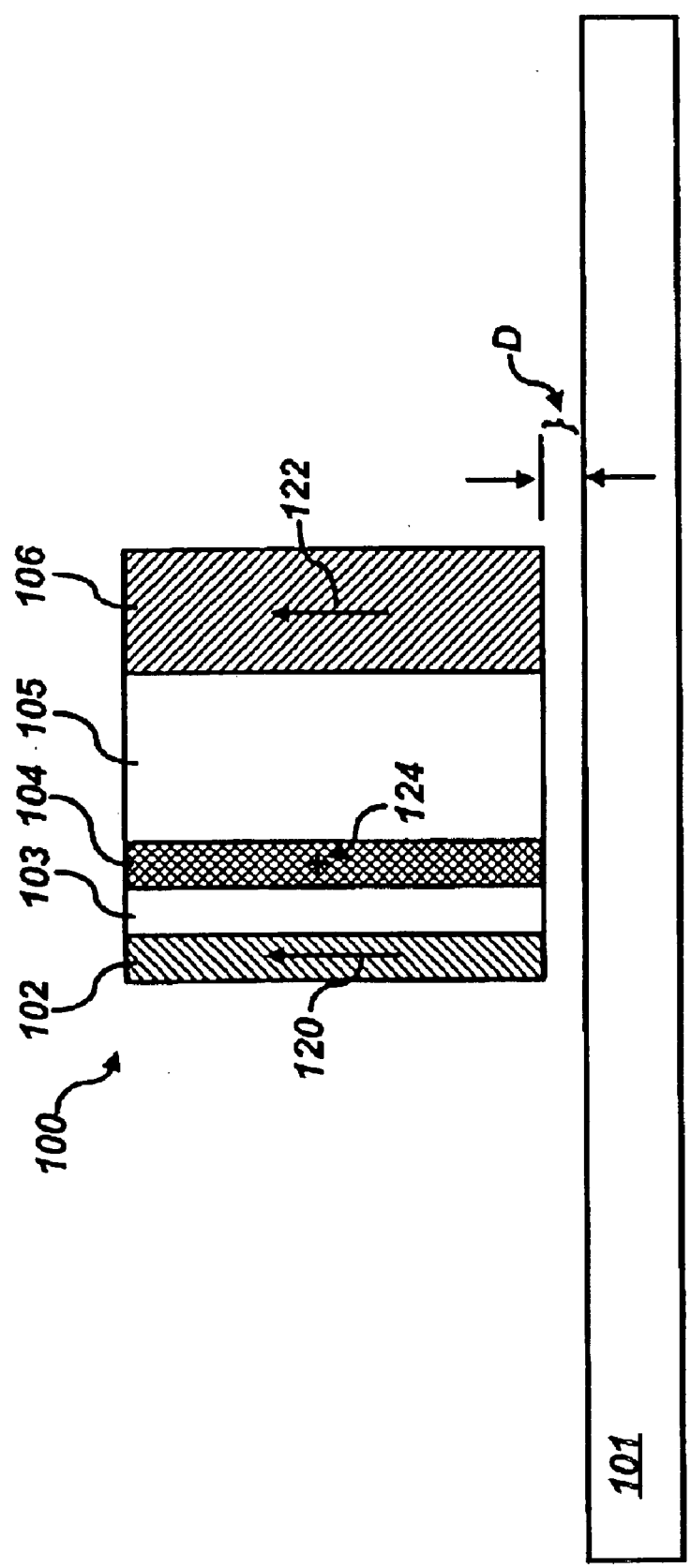
FIG. 2 depicts a side view of the sensor unit illustrated in FIG. 1, in accordance with a preferred embodiment of the present invention.

FIG. 1 illustrates a top view of a sensor unit 100, which can be implemented in accordance with a preferred embodiment of the present invention. The arrows generally indicate the directions of the magnetization. The direction of the magnetization of soft ferromagnet 104 can change when the sensor unit 100, is brought near a magnetic material. FIG. 2 depicts a side view of the sensor unit 100 illustrated in FIG. 1, in accordance with a preferred embodiment of the present invention. In FIGS. 1 and 2 like or analogous parts or elements are indicated by identical reference numerals. Sensor unit 100 can be, for example, a spin dependent tunneling SDT sensor or a spin valve. Note that SDT sensors and spin valves are well known in the art and thus a detailed explanation of how a typical SDT sensor functions is not necessary for purposes of describing the invention disclosed herein.

As indicated in FIGS. 1 and 2, sensor unit 100 can be located a distance D from a material 101 being probed by the sensor unit 100. Sensor unit 100 includes a hard magnet 102, which is located proximate to an intermediate layer 103 that can be configured as a tunnel barrier or a conductor that comprises a spin valve. Hard magnet 102 generally comprises a hard ferromagnetic layer. A soft magnet 104 is located between intermediate layer 103 and spacer layer 105. Soft magnet 104 generally comprises a soft ferromagnetic layer. A hard magnet 106 can be located proximate to spacer layer 105. Hard magnet 106 also comprises a hard ferromagnetic layer. Note that in general, the arrows 120 and 122, in the illustrated embodiments of FIGS. 1 to 4 indicate how the magnetizations of the ferromagnetic materials may be directed before sensor the unit 100 senses the magnetic properties of the material to be probed.

Figure 3:
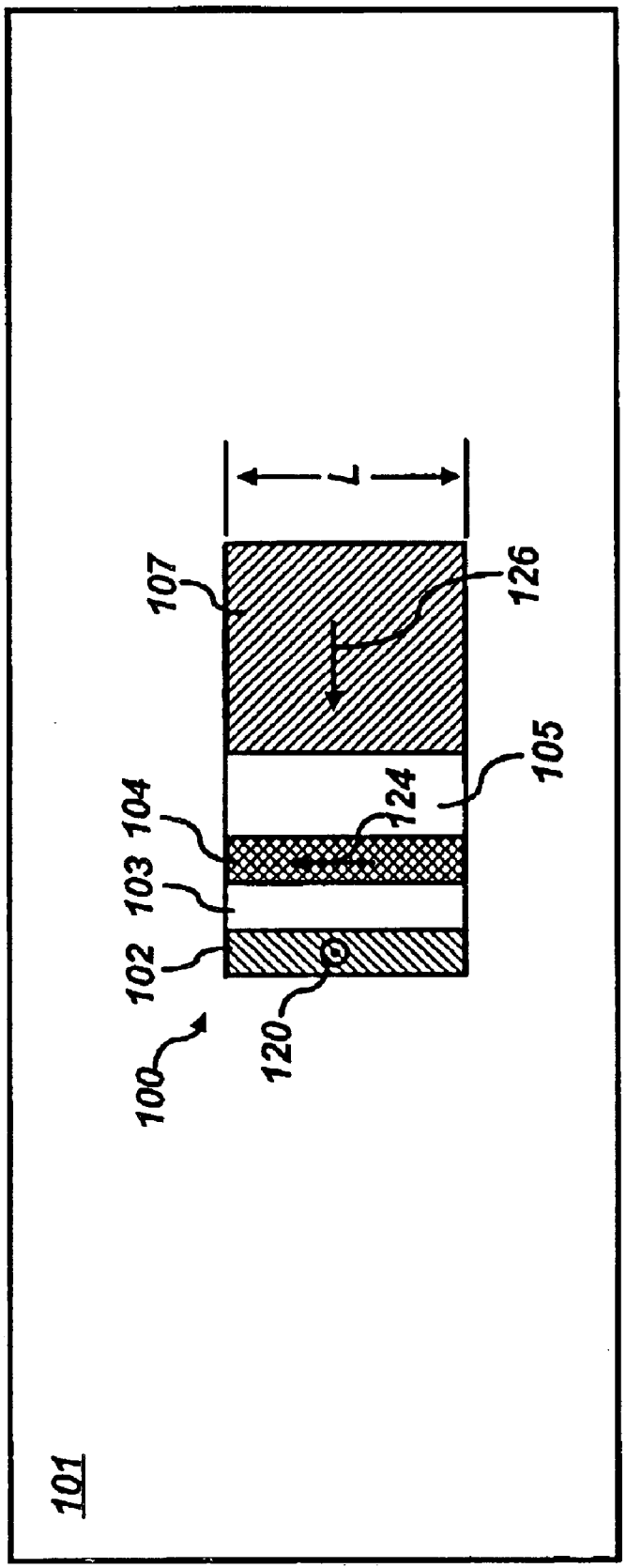
FIG. 3 illustrates a top view of a sensor, which can be implemented in accordance with an alternative embodiment of the present invention.
Figure 4:
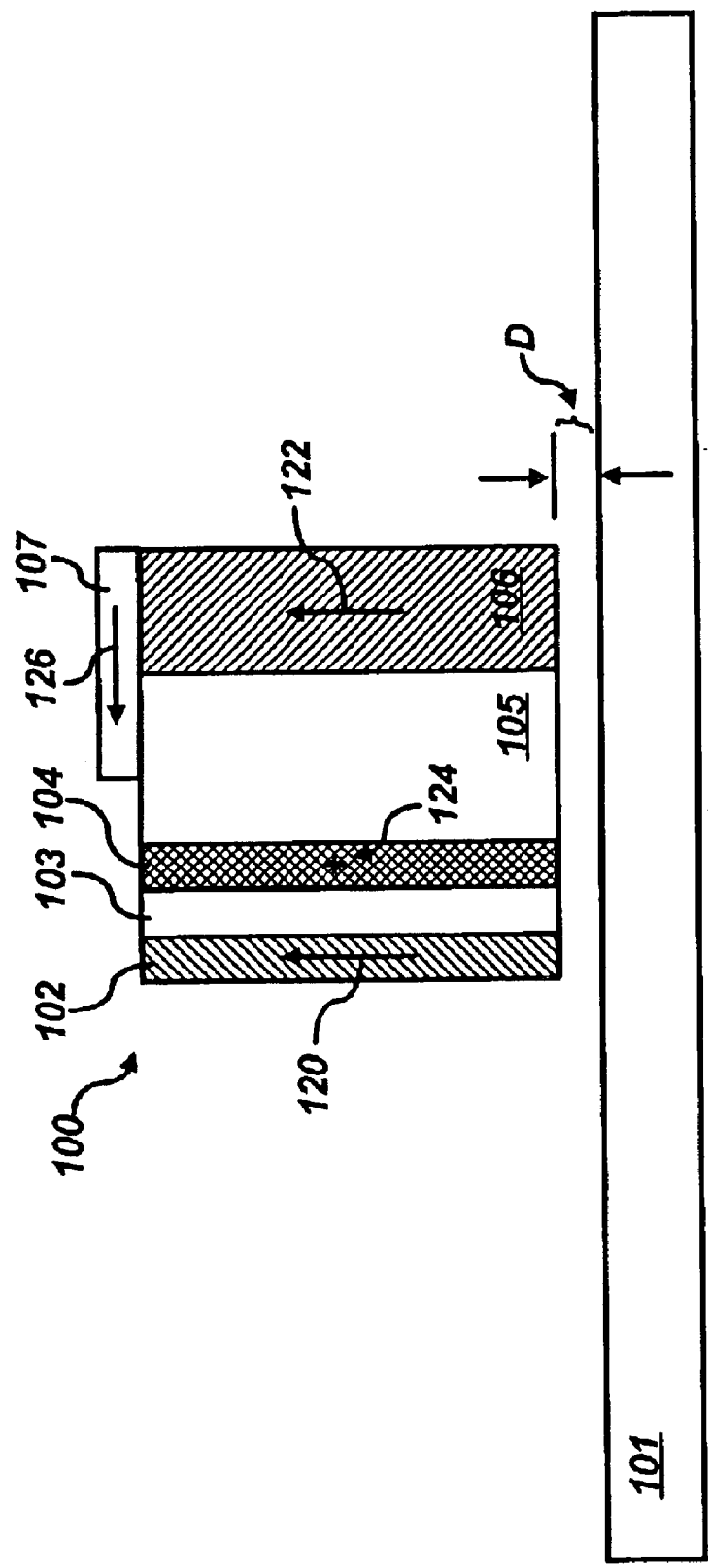
FIG. 4 depicts a side view of the sensor unit illustrated in FIG. 3, in accordance with an alternative embodiment of the present invention.

FIGS. 3 and 4 illustrate alternative embodiments of the present invention in which an additional bridging ferromagnet 107 can be added to facilitate magnetic flux lines traveling through the soft ferromagnet 104 when the sensor unit 100 is brought close to magnetic material 101. This will increase the response of the sensor. FIG. 3 thus illustrates a top view of a sensor unit 100, which can be implemented in accordance with an alternative embodiment of the present invention. FIG. 4 depicts a side view of the sensor unit 100 illustrated in FIG. 3, in accordance with an alternative embodiment of the present invention. Note that in FIGS. 1 to 4, like or analogous parts or elements are generally indicated by identical reference numerals.

If intermediate layer 103 constitutes an insulator, then conduction occurs between hard magnet 102 and soft magnet 104 via tunneling. The tunneling impedance depends on the magnetization direction of the soft magnetic material, which composes soft magnet 104. If the magnetization of soft magnet 104 is parallel to the magnetization of hard magnet 102, then the impedance thereof comprises minimum impedance. If intermediate layer 103 is a conductor, then conduction occurs in the plane of the layers 102, 103, and 104. If the magnetization of soft magnet 104 is parallel to the magnetization of hard magnet 102, then the impedance in the plane conduction can comprise minimum impedance.

The thickness of spacer layer 105 and hard magnet 106 (i.e., a hard ferromagnetic layer) is generally greater than the thickness of intermediate layer 103 (i.e., wherein layer 103 can be an insulator or a conductor) and hard magnet 102 (i.e., a hard ferromagnetic layer), respectively. When the distance D indicated is comparable to the thickeners of the spacer layer 105, there will be a magnetic interaction between the hard magnet 106 and the soft magnet 104 that changes the direction of magnetization of soft magnet 104. The amount of change thereof depends generally on the properties of the magnetic material 101 beneath spacer layer 105. The amount of change depends on the permeability of the magnetic material 101.

If the magnetic material 101 has a large permeability and the distance D is small, then there is an easy flux path connecting the two magnets 104 and 106. The result of this is that, if the magnetization of the magnet 106 is directed up (or down), then the magnetization of the magnet 104 will tend to be directed down (or up). If the magnetization of the magnet 102 is up, this will tend to increase (or decrease) the tunneling impedance between hard magnet 102 and soft magnet 104 or spin valve impedance. By translating the sensor unit 100, which is configured to include hard magnet 102, intermediate layer 103, soft magnet 104, spacer layer 105 and hard magnet 106, and possibly the bridging ferromagnet 107 one can probe the permeability of material 101 at different locations along its surface. The magnetic field direction of ferromagnet 107 is generally indicated in FIGS. 3 and 4 by arrow 126. The length over which one probes this property of material 101 is approximately the thickness of spacer layer 105. Note that hard magnet 102 generally comprises a first hard ferromagnetic layer, while hard magnet 106 generally comprises a second hard ferromagnetic layer.

By translating the sensor unit 100 that comprises hard magnet 102, intermediate layer 103, and soft magnet 104, one can thus probe the magnetic permeability of material 101 at different locations along its surface. The length over which one probes such properties of material 101 is approximately the thickness of the intermediate layer 103 (e.g., an insulator or insulating layer). An example of such a length is 1–2 nm.

Based on the foregoing it can be appreciated that the present invention describes systems and methods for probing the magnetic permeability of a material are described herein. A sensor unit, such as sensor unit 100, can be configured to comprise magnet layers thereof, including a soft ferromagnetic layer, a first hard ferromagnetic layer and a second hard ferromagnetic layer. An intermediate layer (i.e., an insulating layer or conduction layer) can be disposed between the first hard ferromagnetic layer and the soft ferromagnetic layer within the sensor unit. Additionally, a spacer layer can be disposed between the soft ferromagnetic layer and the second hard ferromagnetic layer, wherein the sensor unit measures the magnetic properties of a material located a distance from the sensor unit through the magnetic interaction of the magnetic layers of the sensor unit. Conduction between the first hard ferromagnetic layer and the soft ferromagnetic layer generally occurs via tunneling if intermediate layer 103 is an insulator. If intermediate layer 103 is a conductor, then conduction occurs in the plane of layers 102, 103, and 104.

Additionally, the thickness of the spacer layer and the thickness of the second hard ferromagnetic layer are respectively greater than the thickness of the insulating or conducting (layer and the thickness of the second hard ferromagnetic layer. A magnetic interaction generally occurs between the second hard ferromagnetic layer and the soft ferromagnetic layer, if the distance of the sensor to a magnetic surface is approximately equal to the thickness of the spacer layer. In addition, a change in magnetization of the soft ferromagnetic layer results in a change in impedance between the first hard ferromagnetic layer and the soft ferromagnetic layer or a change in the impedance of the spin valve. The sensor unit can also be configured for use in probing over short lengths (e.g., 1–2 nm).

Several advantages are afforded by varying embodiments of the present invention. The device described herein, including systems and methods thereof, can be adapted to probe the magnetic permeability of magnetic surface layers that include magnetic recording media. The length over which one probes the material utilizing the sensor unit described herein can be varied. Adding the bridging ferromagnetic can increase the sensitivity of the device.

Because the device described herein can be implemented as a miniature magnetic sensor (e.g., a MEMS type device), a number of applications are available for sensing the local magnetic permeability in a variety of materials, it lends itself to a variety of uses including industrial, biomedical, oceanographic, environmental, military, and space related applications, to name a few. The trend in magnetic sensor design and development is constantly evolving toward smaller size, lower power consumption and lower cost for similar performance. Thus, the device described herein, including systems and methods thereof, is ideally suited for use with magnetic sensing applications, including MEMS-type components.

Figure 5:
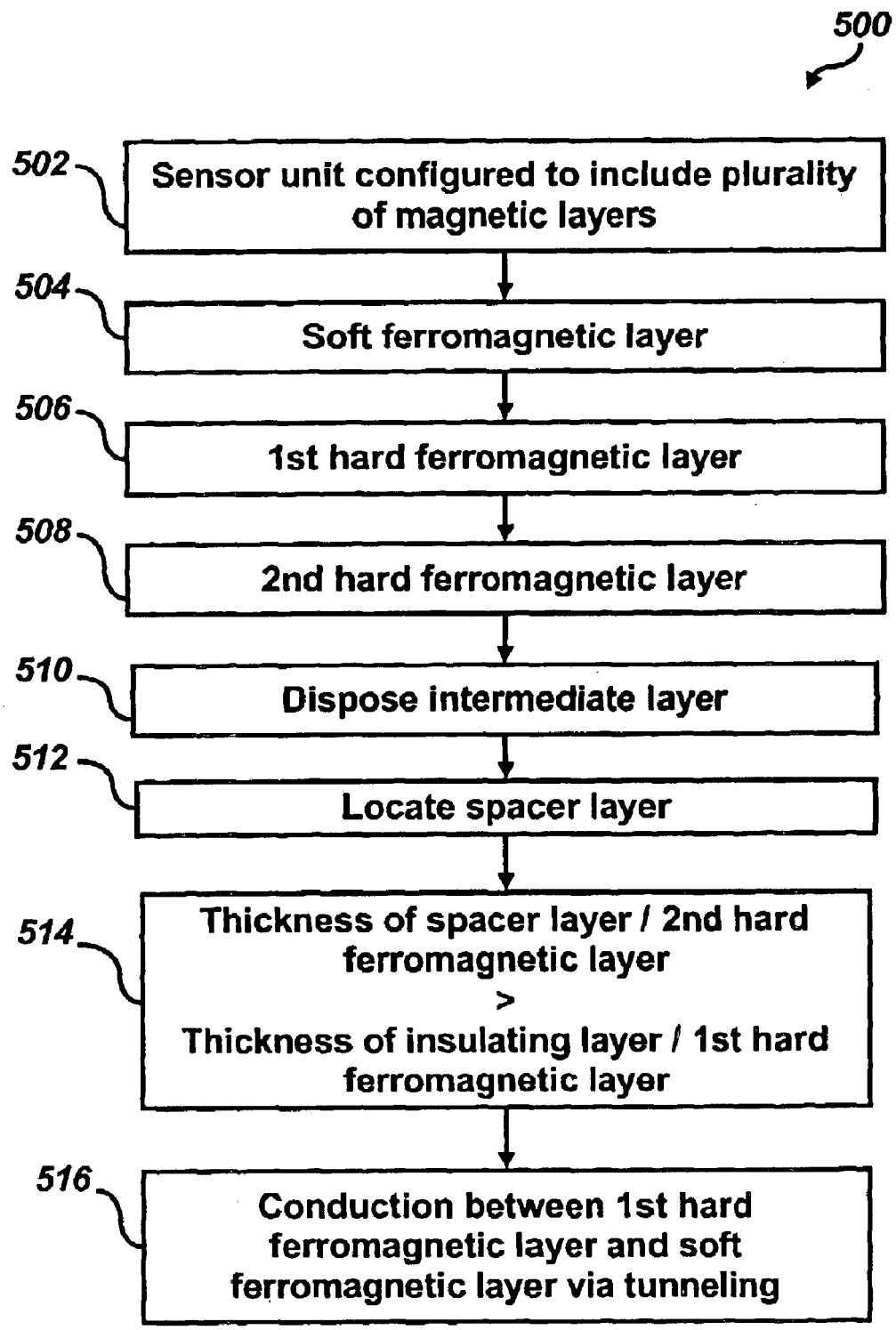
FIG. 5 illustrates a high-level flow chart of operations depicting logical operations, which may be implemented for configuring a sensor in accordance with a preferred embodiment of the present invention.

FIG. 5 illustrates a high-level flow chart 500 of operations depicting logical operations, which may be implemented for configuring a sensor in accordance with a preferred embodiment of the present invention. FIG. 5 thus generally illustrates a methodology for implementing a sensor for probing the magnetic permeability of a material. As depicted at block 502 of FIG. 5, a sensor unit can be configured to include a plurality of magnetic layers thereof. Such magnetic layers can include, for example, a soft ferromagnetic layer, as depicted at block 504, a first hard ferromagnetic layer as described at block 506, and a second hard ferromagnetic layer, as depicted at block 508.

Thereafter, as described at block 510, an intermediate layer (i.e., insulating layer or conducting layer) can be disposed between the first hard ferromagnetic layer and the soft ferromagnetic layer within the sensor unit. Next, as illustrated at block 512, a spacer layer can be located between the soft ferromagnetic layer and the second hard ferromagnetic layer, such that the sensor unit formed thereof can measure the magnetic permeability of a material located a distance from the sensor unit through the magnetic interaction of the magnetic layers of the sensor unit.

As depicted next at block 514, the sensor unit and the magnetic layers thereof can be configured, such that a thickness of the spacer layer and a thickness of the second hard ferromagnetic layer are respectively greater than a thickness of the insulating or conducting layer and a thickness of the first hard ferromagnetic layer. Finally, as illustrated at block 516, conduction between the first hard ferromagnetic layer and the soft ferromagnetic layer can occur via tunneling if intermediate layer 103 is an insulator, or the conduction can occur in-plane if intermediate layer 103 is a conductor. In general, the length L of the layers 102 to 106, should be longer than the average domain size of the material whose properties are being probed. The length L of the respective first and second hard ferromagnetic layers 102 and 106, the intermediate layer 103, the soft ferromagnetic layer 104, and the spacer layer 105 should be greater than an average domain size of the material requiring probing by the sensor unit indicated herein. Such a length L can be, for example, approximately 100 microns.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the scope of the following claims. It is contemplated that the use of the present invention can involve components having different characteristics. It is intended that the scope of the present invention be defined by the claims appended hereto, giving full cognizance to equivalents in all respects.

The embodiments of an invention in which an exclusive property or right is claimed are defined as follows:

1. A system for probing the magnetic permeability of a material, said system comprising:

a sensor unit that comprises magnet layers thereof, including a soft ferromagnetic layer, a first hard ferromagnetic layer and a second hard ferromagnetic layer, an intermediate layer disposed between said first hard ferromagnetic layer and said soft ferromagnetic layer within said sensor unit;

a spacer layer disposed between said soft ferromagnetic layer and said second hard ferromagnetic layer, wherein said sensor unit measures the magnetic permeability of a material located a distance from said sensor unit through the magnetic interaction of said magnetic layers of said sensor unit;

wherein a thickness of said spacer layer and a thickness of said second hard ferromagnetic layer are respectively greater than a thickness of said intermediate layer and a thickness of said first hard ferromagnetic layer.

2. The system of claim 1 wherein a magnetic interaction occurs between said second hard ferromagnetic layer and said soft ferromagnetic layer, if said distance is approximately equal to a thickness of said spacer layer.

3. The system of claim 1 wherein a change in magnetization of said soft ferromagnetic layer results in a change in impedance between said first hard ferromagnetic layer and said soft ferromagnetic layer.

4. The system of claim 1 wherein a change in magnetization of said soft ferromagnetic layer results in a change in in-plane conduction thereof.

5. The system of claim 1 wherein said sensor unit is moveable in at least one direction proximate to said material for probing thereof.

6. The system of claim 1 wherein a length L of said first and second hard ferromagnetic layers, said intermediate layer, said soft ferromagnetic layer, and said spacer layer is greater than an average domain size of said material located said distance from said sensor unit.

7. The system of claim 6 wherein said length L is approximately 100 microns.

8. A method for probing the magnetic permeability of a material, said method comprising steps of:
configuring a sensor unit to comprise magnet layers thereof, including a soft ferromagnetic layer, a first hard ferromagnetic layer and a second hard ferromagnetic layer;
disposing an intermediate layer between said first hard ferromagnetic layer and said soft ferromagnetic layer within said sensor unit;
locating a spacer layer between said soft ferromagnetic layer and said second hard ferromagnetic layer, wherein said sensor unit measures the magnetic permeability of a material located a distance from said sensor unit through the magnetic interaction of said magnetic layers of said sensor unit; and
configuring a thickness of said spacer layer and a thickness of said second hard ferromagnetic layer to be respectively greater than a thickness of said intermediate layer and a thickness of said first hard ferromagnetic layer.

9. The method of claim 8 wherein a magnetic interaction occurs between said second hard ferromagnetic layer and said soft ferromagnetic layer, if said distance is approximately equal to a thickness of said spacer layer.

10. The method of claim 8 wherein a change in magnetization of said soft ferromagnetic layer results in a change in impedance between said first hard ferromagnetic layer and said soft ferromagnetic layer.

11. The method of claim 8 wherein a length L of said first and second hard ferromagnetic layers, said intermediate layer, said soft ferromagnetic layer, and said spacer layer is greater than an average domain size of said material located said distance from said sensor unit.

12. A method for probing the magnetic permeability of a material, said method comprising steps of:
configuring a sensor unit to comprise magnet layers thereof, including a soft ferromagnetic layer, a first hard ferromagnetic layer and a second hard ferromagnetic layer;
disposing an intermediate layer between said first hard ferromagnetic layer and said soft ferromagnetic layer within said sensor unit;
locating a spacer layer between said soft ferromagnetic layer and said second hard ferromagnetic layer, wherein said sensor unit measures the magnetic permeability of a material located a distance from said sensor unit through the magnetic interaction of said magnetic layers of said sensor unit;
configuring a length L of said first and second hard ferromagnetic layers, said intermediate layer, said soft ferromagnetic layer, and said spacer layer to be greater than an average domain size of said material located said distance from said sensor unit.

13. The system of claim 1 wherein said intermediate layer comprises an insulator.

14. The system of claim 1 wherein said intermediate layer comprises a conductor.

15. The system of claim 1 wherein conduction between said first hard ferromagnetic layer and said soft ferromagnetic layer occurs via tunneling.

16. The system of claim 1 wherein conduction between said first hard ferromagnetic layer said soft ferromagnetic layer occurs via in-plane conduction.

17. The method of claim 8 wherein said intermediate layer comprises an insulator.

18. The method of claim 8 wherein said intermediate layer comprises a conductor.

* * * * *